(12) United States Patent
Maeda et al.

(10) Patent No.: US 8,728,939 B2
(45) Date of Patent: May 20, 2014

(54) METHOD FOR MANUFACTURING SEMICONDUCTOR DEVICE AND SEMICONDUCTOR MANUFACTURING SYSTEM

(71) Applicants: Kazuhiro Maeda, Tokyo (JP); Koichiro Nishizawa, Tokyo (JP)

(72) Inventors: Kazuhiro Maeda, Tokyo (JP); Koichiro Nishizawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/761,285

(22) Filed: Feb. 7, 2013

(65) Prior Publication Data
US 2013/0323910 A1 Dec. 5, 2013

(30) Foreign Application Priority Data
May 31, 2012 (JP) ................. 2012-124051

(51) Int. Cl.
*H01L 21/44* (2006.01)
(52) U.S. Cl.
USPC ........... 438/678; 205/118; 205/123; 205/157; 414/936; 324/762.05
(58) Field of Classification Search
CPC ............ H01L 21/2885; H01L 21/3065; H01L 21/67207; H01L 21/68; H01L 21/6831; H01L 21/68728; H01L 21/32125; H01L 21/6715; H01L 21/68707; H01L 21/68785
USPC ........... 438/678; 205/118, 123, 157; 414/936; 324/762.05
See application file for complete search history.

(56) References Cited

U.S. PATENT DOCUMENTS

| | | | |
|---|---|---|---|
| 2004/0055707 A1* | 3/2004 | Sato et al. ................ | 156/345.11 |
| 2004/0129576 A1* | 7/2004 | Makino et al. ................ | 205/222 |
| 2005/0274604 A1* | 12/2005 | Saito et al. .................... | 204/198 |
| 2005/0284748 A1* | 12/2005 | Dordi et al. ................... | 204/227 |
| 2007/0131170 A1* | 6/2007 | Shimizu et al. ........... | 118/723 E |
| 2007/0141951 A1* | 6/2007 | Naoki et al. ...................... | 451/5 |
| 2008/0009082 A1* | 1/2008 | Kasukabe et al. ............. | 438/17 |
| 2010/0210122 A1* | 8/2010 | Hasegawa et al. ............. | 439/78 |
| 2012/0181180 A1* | 7/2012 | Frodis et al. .................... | 205/84 |
| 2013/0010099 A1* | 1/2013 | Andrews et al. ................ | 348/79 |
| 2013/0075982 A1* | 3/2013 | Simmons et al. ................ | 279/3 |

FOREIGN PATENT DOCUMENTS

| | | |
|---|---|---|
| JP | 10-46394 A | 2/1998 |
| JP | 2002-69698 A | 3/2002 |
| JP | 2002-222746 A | 8/2002 |
| JP | 2008-42106 A | 2/2008 |
| JP | 2009-295849 A | 12/2009 |

* cited by examiner

*Primary Examiner* — Bac Au
(74) *Attorney, Agent, or Firm* — Leydig, Voit & Mayer, Ltd.

(57) ABSTRACT

A single-crystal substrate is placed on a supporting table while maintaining crystalline orientation of the single-crystal substrate. The single-crystal substrate has contacting regions on a periphery of an upper surface of the single-crystal substrate. Linear contacting surfaces of contacting pins are placed in contact with the contacting regions of the single-crystal substrate placed on the supporting table. Longitudinal directions on the contacting surfaces of all the contacting pins are not parallel to intersecting lines of the upper surface of the single-crystal substrate and cleaved surfaces of the single-crystal substrate.

20 Claims, 2 Drawing Sheets

METHOD FOR MANUFACTURING SEMICONDUCTOR DEVICE AND SEMICONDUCTOR MANUFACTURING SYSTEM

BACKGROUND OF THE INVENTION

1. Field of the Invention

The present invention relates to a semiconductor manufacturing system, such as a semiconductor film forming system, a metal film forming system, an etching system, or a plating system; and a method for manufacturing a semiconductor device using the same.

2. Background Art

When a semiconductor device is manufactured using a semiconductor manufacturing system, there has been a case wherein a plural number of contacting pins are contacted to a plural number of contacting regions of a single-crystal substrate supported with a supporting table (for example, refer to Japanese Patent Laid-Open No. 2009-295849).

SUMMARY OF THE INVENTION

In conventional devices, the longitudinal direction on the contact surfaces of the three contacting pins facing the center of the single-crystal substrate, and the longitudinal direction on contact surfaces among one of the three contacting pins was parallel to the intersecting line of the upper surface of the single-crystal substrate and the cleaved surfaces of the single-crystal substrate. Therefore, there was a problem wherein a stress was applied to the cleaved surfaces and cracks were formed in the single-crystal substrate.

In view of the above-described problems, an object of the present invention is to provide a method for manufacturing a semiconductor device and a semiconductor manufacturing system which can prevent cracks on a single-crystal substrate.

According to the present invention, a single-crystal substrate is placed on a supporting table while maintaining a crystalline orientation of the single-crystal substrate. The single-crystal substrate has a plurality of contacting regions on a periphery of an upper surface of the single-crystal substrate. Linear contacting surfaces of a plurality of contacting pins are placed in contact with the contacting regions of the single-crystal substrate placed on the supporting table. Longitudinal directions on the contacting surfaces of all the contacting pins are not parallel to intersecting lines of the upper surface of the single-crystal substrate and cleavage surfaces of the single-crystal substrate.

The present invention makes it possible to prevent cracks on a single-crystal substrate.

Other and further objects, features and advantages of the invention will appear more fully from the following description.

DETAILED DESCRIPTION OF THE PREFERRED EMBODIMENTS

A method for manufacturing a semiconductor device and a semiconductor manufacturing system according to the embodiments of the present invention will be described with reference to the drawings. The same components will be denoted by the same symbols, and the repeated description thereof may be omitted.

First Embodiment

Figure 1:
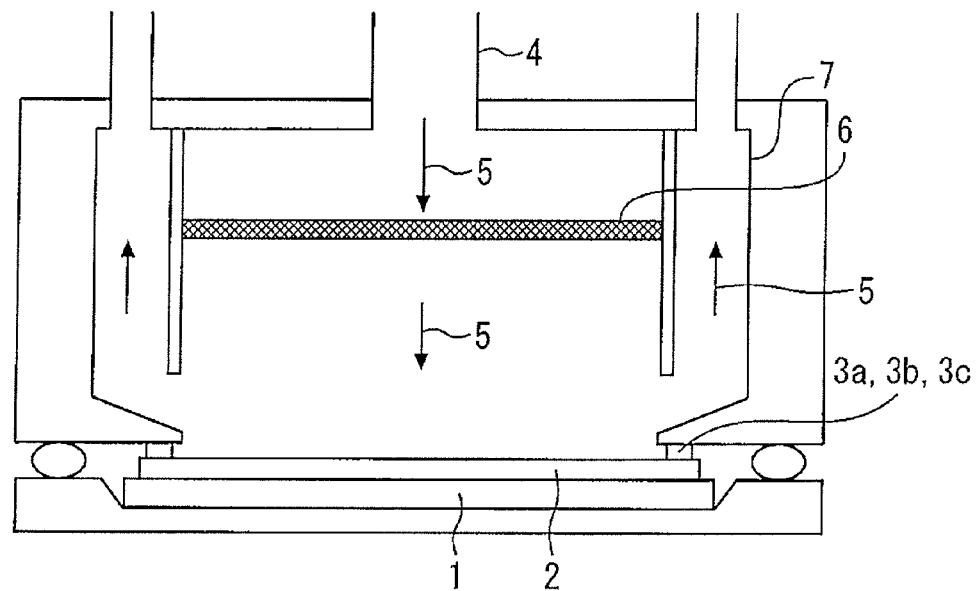
FIG. 1 is a sectional view showing a semiconductor manufacturing system according to the first embodiment of the present invention.

FIG. 1 is a sectional view showing a semiconductor manufacturing system according to the first embodiment of the present invention. This semiconductor manufacturing system is an electrolytic plating device of a cup structure. A single-crystal substrate 2 is placed on a supporting table 1. Contacting pins 3a, 3b, and 3c contact the periphery of the upper surface of the single-crystal substrate 2 placed on a supporting table 1. A plating solution 5 injected from a plating solution injecting port 4 is supplied to the surface of the single-crystal substrate 2 via an anode mesh 6. Thereafter, the plating solution 5 is delivered from a plating solution delivering port 7. As the plating solution 5, a solution of a metal such as Au, Ni, or Cu ions, or a solution containing a semiconductor material can be used.

Figure 2:
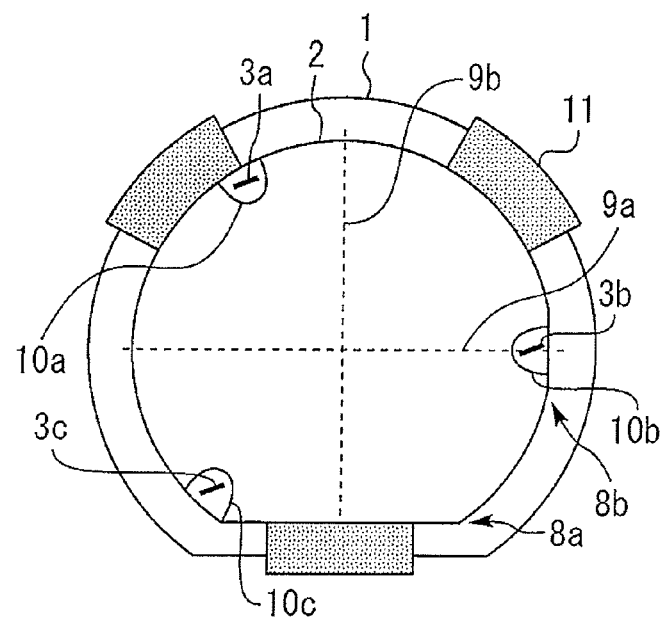
FIG. 2 is a plan view showing the positional relation of the contacting pins and a single-crystal substrate according to the first embodiment of the present invention.

FIG. 2 is a plan view showing the positional relation of the contacting pins and a single-crystal substrate according to the first embodiment of the present invention. The single-crystal substrate 2 is a GaAs substrate (hereafter referred to GaAs (100) substrate) of the plane orientation of (100). Two orientation flats 8a and 8b showing the crystalline orientations are provided on the single-crystal substrate 2. The GaAs (100) substrate has two cleavage surfaces (011) and (0-11) having different plane orientations, and the intersecting lines of these and the upper surface of the single-crystal substrate 2 are intersecting lines 9a and 9b. The single-crystal substrate 2 has contacting regions 10a, 10b, and 10c on the periphery of the upper surface.

Since the replacements of the contacting regions 10a, 10b, and 10c are determined, the orientation of the single-crystal substrate 2 is required to be constant. For this reason, the orientation of the orientation flats 8a and 8b (crystal orientation) of the single-crystal substrate 2 to the supporting table 1 are constantly kept by a substrate holding mechanism 11 adapted to the shape of the single-crystal substrate 2. Then, the contacting pins 3a, 3b, and 3c contact the contacting regions 10a, 10b, and 10c of the single-crystal substrate 2 placed on the supporting table 1. In order to achieve stable contact, the tips of the contacting pins 3a, 3b, and 3c are wires having a circular cross-section. Therefore, the contacting surface of the contacting pins 3a, 3b, and 3c contacting to the single-crystal substrate 2 becomes in a linear shape. Since the orientation of the contacting pins 3a, 3b, and 3c can be adjusted with respect to the manufacturing system, the longitudinal directions on the contacting surface of the contacting pins 3a, 3b, and 3c are variable.

The longitudinal directions on the contacting surface of the contacting pins 3a, 3b, and 3c do not face the center of the single-crystal substrate 2. Therefore, the longitudinal directions on the contacting surfaces of all the contacting pins 3a, 3b, and 3c are not parallel to the intersecting lines 9a and 9b.

Next, a method for manufacturing a semiconductor device according to the first embodiment of the present invention will be described. First, a single-crystal substrate 2 is placed on the supporting table 1 while maintaining the orientation of the orientation flats 8a and 8b (crystalline orientation) of the single-crystal substrate 2. Next, the contacting pins 3a, 3b, and 3c are placed in contact with the contacting regions 10a, 10b, and 10c of the single-crystal substrate 2 placed on the supporting table 1. Then, while flowing currents from the contacting pins 3a, 3b, and 3c to the single-crystal substrate 2, the plating solution 5 injected from the plating solution injecting port 4 is supplied to the surface of the single-crystal substrate 2 through the anode mesh 6, electrolytic plating is performed on the single-crystal substrate 2. Thereafter, the plating solution 5 is delivered from the plating solution delivering port 7 and circulated by a pump, and electrolytic plating is performed.

Figure 3:
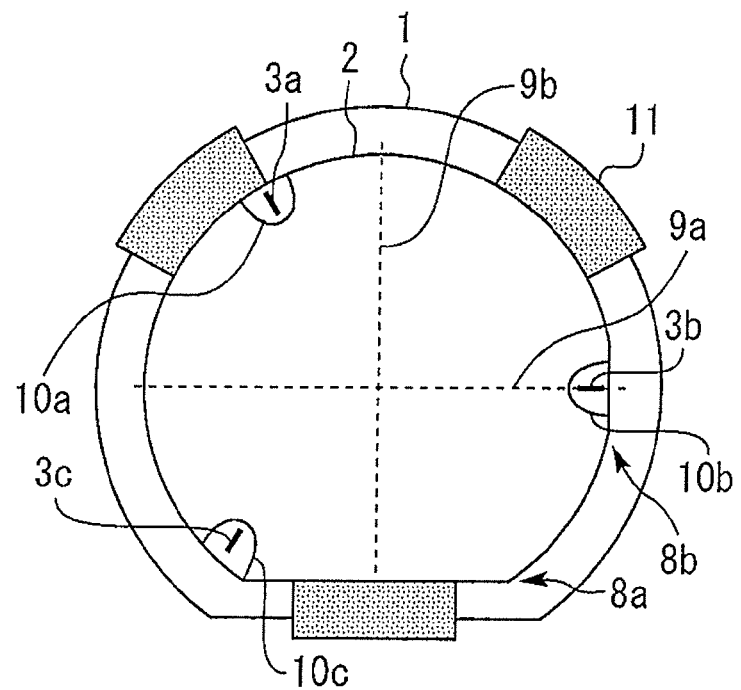
FIG. 3 is a plan view showing the positional relations of the contacting pins and the single-crystal substrate according to the comparative example.

Next, the effect of the present embodiment will be explained comparing with a comparative example. FIG. 3 is a plan view showing the positional relations of the contacting pins and the single-crystal substrate according to the comparative example. In the comparative example, the longitudinal directions on the contacting surface of the contacting pins 3a, 3b, and 3c faces the center of the single-crystal substrate 2. For this reason, the longitudinal direction on the contacting surface of one of contacting pins 3a, 3b, and 3c is parallel to the intersecting lines 9a and 9b. Therefore, stress is applied to the cleaved surface, and cracks are formed on the single-crystal substrate 2.

In the present embodiment on the other hand, the longitudinal directions on the contacting surface of the contacting pins 3a, 3b, and 3c do not face the center of the single-crystal substrate 2. Therefore, the longitudinal directions on the contacting surfaces of all the contacting pins 3a, 3b, and 3c are not parallel to the intersecting lines 9a and 9b. As a result, since stress acting to the cleaved surface can be lowered, the occurrence of cracks on the single-crystal substrate 2 can be prevented.

Table 1 shows the results of measurements of crack occurrence by varying the angles in the longitudinal direction on the contacting surface of the contacting pins against the intersecting line between the upper surface and the cleaved surface of the GaAs (100) substrate. The substrate was circular with a diameter of 100 mm and a substrate thickness of 100 μm, and was fixed to a single-crystal sapphire substrate using a wax material. As the result of the measurement, although the crack generating percentage was 1.86% at the angle of 0°, it was reduced to 0% at the angle of 45°. Therefore, it was confirmed that if the longitudinal direction on the contacting surface of the contacting pins was not parallel to the intersecting line, the occurrence of cracks in the single-crystal substrate could be prevented.

In addition, it is preferable that the longitudinal directions on the contacting surfaces of all the contacting pins 3a, 3b, and 3c are identical. Thereby, the angles different from the angles of the intersecting lines 9a and 9b are easily taken. Furthermore, the device designers can easily design the orientation of the contacting pins 3a, 3b, and 3c.

Furthermore, the angles formed by the longitudinal directions on the contacting surfaces of the contacting pins 3a, 3b, and 3c are preferably multiples of the angle formed by the intersecting lines 9a and 9b. In this case, if the longitudinal directions on the contacting surfaces of one of the contacting pins 3a, 3b, and 3c are misaligned from the intersecting lines 9a and 9b, the longitudinal directions on the contacting surfaces of all the contacting pins 3a, 3b, and 3c are different from the directions of the intersecting lines 9a and 9b. Therefore, the angles of the contacting pins 3a, 3b, and 3c can be easily adjusted. Here, the cleaved surfaces of various substrates and the angles between intersecting lines of the cleaved surfaces and substrate surfaces are shown in Table 2.

As Table 2 shows, since the angle formed by the intersecting lines 9a and 9b themselves is 30° when the single-crystal substrate 2 is a SiC (0001) substrate, the respective angles formed by the longitudinal directions on the contacting surfaces of the contacting pins 3a, 3b, and 3c are made to be multiples of 30°. Since the angle formed by the intersecting lines themselves is 60° when the single-crystal substrate 2 is a GaN (0001) substrate or a Si (111) substrate, the respective angles formed by the longitudinal direction on the contacting surfaces of the contacting pins 3a, 3b, and 3c are made to be multiples of 60°. Since the angle formed by the intersecting lines themselves is 90° when the single-crystal substrate 2 is one of the Si (100) substrate, the GaAs (100) substrate, or the InP (100) substrate, the respective angles formed by the longitudinal direction on the contacting surfaces of the contacting pins 3a, 3b, and 3c are made to be multiples of 90°.

The material of the contacting pins 3a, 3b, and 3c is not spring-like, but selected by the electrical conductivity and the deposition of plating. Although the electrical conductivity is elevated in the order of SUS<Pt<Au, Pt and Au are easy to deposit as plating, and the adherence with the deposited plating is strong, the treatment is difficult. On the other hand, since SUS is difficult to deposit as plating, and the adherence with the deposited plating is weak and the deposited materials are easily peeled off, the maintenance and control of the device can be very easily performed, it is suited as the material of the contacting pin.

Second Embodiment

Figure 4:
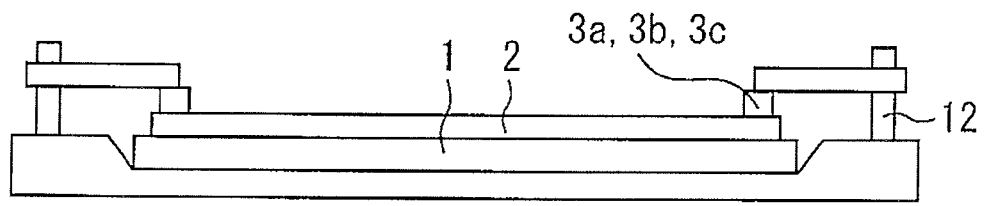
FIG. 4 is a sectional view showing a semiconductor manufacturing system according to the second embodiment of the present invention.

FIG. 4 is a sectional view showing a semiconductor manufacturing system according to the second embodiment of the present invention. The contacting pins 3a, 3b, and 3c are fixed to the substrate fixing portion 12. This semiconductor manufacturing system is not limited to be used in the plating device of the first embodiment, but can also be used in a semiconductor film forming system, a metal film forming system, an etching system, and so on. Other components are similar to the components of the first embodiment, and effects similar to those of the first embodiment can be obtained.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-124051, filed on May 31, 2012, including specification, claims, drawings, and summary, on which the Convention priority of the present application is based, is incorporated herein by reference in its entirety.

What is claimed is:

1. A method for manufacturing a semiconductor device comprising:

placing a single-crystal substrate, which has a plurality of contacting regions on a periphery of an upper surface of the single-crystal substrate, on a supporting table while maintaining crystalline orientation of the single-crystal substrate; and placing linear contacting surfaces of a plurality of contacting pins in contact with the contacting regions of the single-crystal substrate placed on the supporting table, wherein longitudinal directions on the contacting surfaces of all the contacting pins are not parallel to intersecting lines of the upper surface of the single-crystal substrate and cleaved surfaces of the single-crystal substrate.

2. The method for manufacturing a semiconductor device according to claim 1, wherein the longitudinal directions on the contacting surfaces do not face a center of the single-crystal substrate.

3. The method for manufacturing a semiconductor device according to claim 1, further comprising electrolytically plating the single-crystal substrate while current flows from the contacting pins to the single-crystal substrate.

4. The method for manufacturing a semiconductor device according to claim 1, wherein
the cleaved surfaces have first and second cleaved surfaces having different crystalline plane orientations,
intersecting lines of the upper surface of the single-crystal substrate and the first and second cleaved surfaces are first and second intersecting lines, and
angles formed by the longitudinal directions on the contacting surfaces of the contacting pins are multiples of an angle formed by the first and second intersecting lines.

5. The method for manufacturing a semiconductor device according to claim 4, wherein
the single-crystal substrate is a SiC substrate having a plane orientation of (0001), and
the angles formed by the longitudinal directions on the contacting surfaces of the contacting pins are multiples of 30°.

6. The method for manufacturing a semiconductor device according to claim 4, wherein
the single-crystal substrate is any one of a GaN substrate having a plane orientation of (0001) and a Si substrate having a plane orientation of (111), and
the angles formed by the longitudinal directions on the contacting surfaces of the contacting pins are multiples of 60°.

7. The method for manufacturing a semiconductor device according to claim 4, wherein
the single-crystal substrate is any one of a Si substrate having a plane orientation of (100), a GaAs substrate having a plane orientation of (100), and an InP substrate having a plane orientation of (100), and
the angles formed by the longitudinal directions on the contacting surfaces of the contacting pins are multiples of 90°.

8. The method for manufacturing a semiconductor device according to claim 1, wherein the longitudinal directions on the contacting surfaces of all the contacting pins are identical.

9. The method for manufacturing a semiconductor device according to claim 1, wherein the longitudinal directions on the contacting surfaces of the contacting pins are variable.

10. The method for manufacturing a semiconductor device according to claim 1, wherein material of the contacting pins is SUS.

11. A semiconductor manufacturing system comprising:
a supporting table;
a single-crystal substrate on the supporting table with a crystalline orientation of the single-crystal substrate, the single-crystal substrate has a plurality of contacting regions on a periphery of an upper surface of the single-crystal substrate; and
a plurality of contacting pins having linear contacting surfaces in contact with the contacting regions of the single-crystal substrate placed on the supporting table, wherein longitudinal directions on the contacting surfaces of all the contacting pins are not parallel to intersecting lines of the upper surface of the single-crystal substrate and cleaved surfaces of the single-crystal substrate.

12. The semiconductor manufacturing system according to claim 11, wherein the longitudinal directions on the contacting surfaces do not face a center of the single-crystal substrate.

13. The semiconductor manufacturing system according to claim 11, further comprising means for electrolytic plating on the single-crystal substrate while current flows from the contacting pins to the single-crystal substrate.

14. The semiconductor manufacturing system according to claim 11, wherein
the cleaved surfaces have first and second cleaved surfaces having different crystalline plane orientations,
intersecting lines of the upper surface of the single-crystal substrate and the first and second cleaved surfaces are first and second intersecting lines, and
angles formed by the longitudinal directions on the contacting surfaces of the contacting pins are multiples of an angle formed by the first and second intersecting lines.

15. The semiconductor manufacturing system according to claim 14, wherein
the single-crystal substrate is a SiC substrate having a plane orientation of (0001), and
the angles formed by the longitudinal directions on the contacting surfaces of the contacting pins are multiples of 30°.

16. The semiconductor manufacturing system according to claim 14, wherein
the single-crystal substrate is any one of a GaN substrate having a plane orientation of (0001) and a Si substrate having a plane orientation of (111), and
the angles formed by the longitudinal directions on the contacting surfaces of the contacting pins are multiples of 60°.

17. The semiconductor manufacturing system according to claim 14, wherein
the single-crystal substrate is any one of a Si substrate having a plane orientation of (100), a GaAs substrate having a plane orientation of (100), and an InP substrate having a plane orientation of (100), and
the angles formed by the longitudinal directions on the contacting surfaces of the contacting pins are multiples of 90°.

18. The semiconductor manufacturing system according to claim 11, wherein the longitudinal directions on the contacting surfaces of all the contacting pins are identical.

19. The semiconductor manufacturing system according to claim 11, wherein the longitudinal directions on the contacting surfaces of the contacting pins are variable.

20. The semiconductor manufacturing system according to claim 11, wherein material of the contacting pins is SUS.

* * * * *